United States Patent [19]
Homma et al.

[11] Patent Number: 5,106,821
[45] Date of Patent: Apr. 21, 1992

[54] PROCESS FOR FORMING THIN OXIDE FILM

[75] Inventors: Norio Homma; Hiromi Takahashi; Shinji Kawamoto; Hideyuki Kondo; Tadataka Horishita, all of Tokyo, Japan

[73] Assignees: International Superconductivity Technology Center; OKI Electric Industry Co., Ltd.; The Hokkaido Electric Power Company Inc.; The Chugoku Electric Power Co., Inc.; Mitsubishi Metal Corporation, at Tokyo, Japan

[21] Appl. No.: 579,862

[22] Filed: Sep. 10, 1990

[30] Foreign Application Priority Data

Mar. 9, 1990 [JP] Japan .................................. 2-56628

[51] Int. Cl.$^5$ ..................... H01L 39/24; C23C 14/34
[52] U.S. Cl. .................................. 505/1; 204/192.24; 505/731
[58] Field of Search .................. 204/192.12, 192.15, 204/192.22, 192.23, 192.24, 192.3; 505/1, 731, 816

[56] References Cited

U.S. PATENT DOCUMENTS

4,131,533  12/1978  Bialko et al. .................... 204/298.14

FOREIGN PATENT DOCUMENTS

| 63-452 | 1/1988 | Japan | 204/298.18 |
| 63-304525 | 12/1988 | Japan | 204/192.24 |
| 64-17313 | 1/1989 | Japan | 204/192.24 |
| 2-43357 | 2/1990 | Japan | 505/731 |
| 2-47254 | 2/1990 | Japan | 505/731 |

OTHER PUBLICATIONS

*Applied Physics Letters*, vol. 52, No. 26, Jun. 27, 1988, T. Ohmi, "Room-Temperature Copper Metallization . . . ", pp. 2236–2238.

T. Ohmi, *Applied Physics Letters*, "In Situ-Surface Cleaning for Very Low . . . ", vol. 53, No. 1, Jul. 4, 1988, pp. 45–47.

T. Ohmi, *Applied Physics Letters*, "Low Temperature Silicon Epitaxy, . . . ", vol. 53, No. 5, Aug. 1, 1988, pp. 364–366.

T. Ohmi, *Applied Physics Letters*, "Electrical Characterization of Epitaxial Silicon", vol. 54, No. 3, Jan. 16, 1989, pp. 253–255.

T. Ohmi, *Applied Physics Letters*, "Crystal Structure Analysis of Epitaxial Silicon . . . ", vol. 54, No. 6, Feb. 6, 1989, pp. 523–525.

T. Saito, Extended Abstracts of the 21st Confernce on Solid State Devices and Materials, Japan, Aug. 28–30, 1989, pp. 25–28.

Yokosyu (The sectional meeting of "the Physical Society of Japan"), 3'd part, Oct. 3 to 6, 1989, Abstract 6a-ZB-1, p. 372.

2nd International Symposium on Superconductivity, Japan, delivered on Nov. 14, 1989, Abstract, p. 202.

T. Ishiguro et al., Editors, *Advances in Superconductivity II*, Springer-Verlag, published in 1990, pp. 793–796.

H. Yamane, *Applied Physics Letters*, "Y—Ba—Cu—O Superconducting Films . . . ", vol. 53, No. 16, Oct. 17, 1988, pp. 1548–1550.

J. L. Vossen et al., "Thin Film Processes", Academic Press, New York, (1978), pp. 141 and 164–165.

S. Shah et al., Am. Inst. Physics Conference Proceedings No. 165 (1987), pp. 50–57.

S. M. Rossnagel et al., Ibid, pp. 106–113.

*Primary Examiner*—Aaron Weisstuch
*Attorney, Agent, or Firm*—Edward D. Manzo

[57] ABSTRACT

A process for forming a thin oxide film on an underlying surface adapted for film formation thereon according to a radio frequency magnetron sputtering method using an oxide target(s). The excitation frequency is higher than 13.56 MHz and provides a lower negative target self-bias voltage permitting improved film formation.

13 Claims, 9 Drawing Sheets

FIG_3

FIG_4

CENTER OF SUBSTRATE

○ : INTEGRAL INTENSITY RATIO (Cu/Y)
● : INTEGRAL INTENSITY RATIO (Ba/Y)

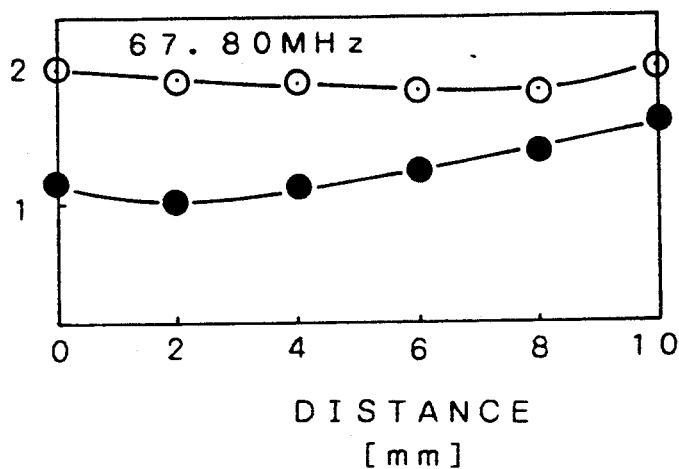
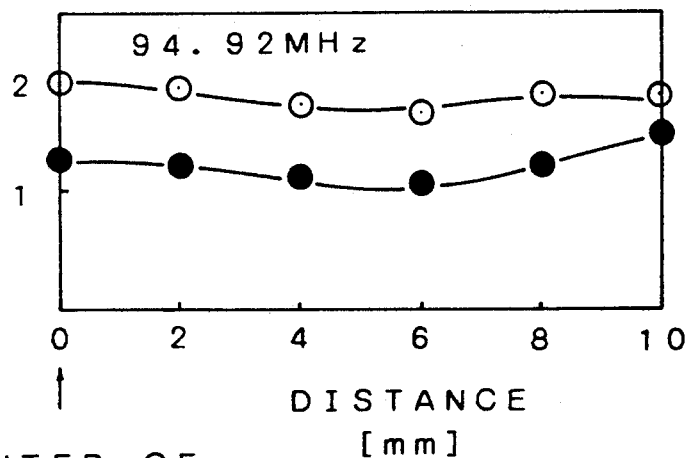
CENTER OF
SUBSTRATE
○ : INTEGRAL INTENSITY RATIO (Cu/Y)
● : INTEGRAL INTENSITY RATIO (Ba/Y)

FIG_8 A
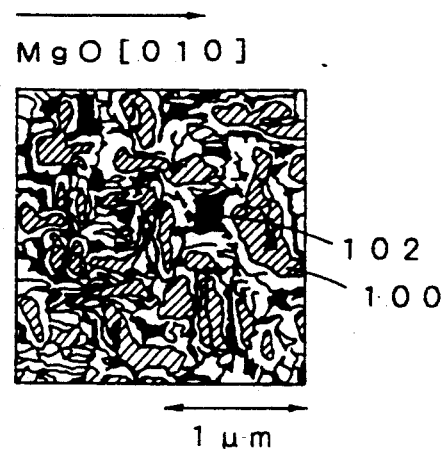
FIG_8 B
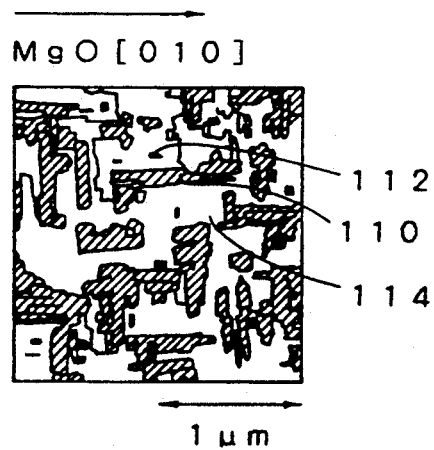

PROCESS FOR FORMING THIN OXIDE FILM

BACKGROUND OF THE INVENTION

1. Field of the Invention

The present invention relates to a process for forming an oxide film on an underlying surface adapted for film formation thereon, according to a radio frequency magnetron sputtering method using an oxide target(s).

2. Discussion of Background Art

A radio frequency (RF) magnetron sputtering method has been known as a means of forming a thin metal or oxide film. In this RF magnetron sputtering method, the so-called industrial frequency of 13.56 MHz is used as the excitation frequency (or radio frequency) for ionization of a sputtering gas.

There have been reported cases of thin metallic film formation where a metal film uniform in a sense of freedom from different orientations is formed using an excitation frequency exceeding the industrial frequency of 13.56 MHz [for example, S. Broydo and C. B. Osburn: "1st. Int. Symp. on Ultra Large Scale Integration Science and Technology 1987", S. Broydo and C. B. Osburn, 87-11, p. 574, "The Electrochemical Society Inc., Penington, (1987)", and T. Ohmi et al., "Room-temperature copper metallization for ultralarge-scale integrated circuits by a low kinetic-energy particle process", *Applied Physics Letter*, vol. 52, p. 2236 (1988). While attempts to improve the properties, such as of composition, uniformity of film thickness, surface morphology (flatness) and crystallinity (orientation), of a thin oxide film by utilizing film formation parameters such as substrate temperature, gas pressure and target composition have been, there have been no reported cases where an excitation frequency higher than the industrial frequency of 13.56 MHz was used to form a thin oxide film using an oxide target(s).

When a thin oxide film is formed through sputtering of an oxide target with an ionized sputtering gas, according to the RF magnetron sputtering method using the industrial frequency of 13.56 MHz, the chemical composition of the thin oxide film greatly differs from the chemical composition of the oxide target. The term "oxide" used herein is intended to encompass compound oxides, containing at least two metallic elements, are particularly referred to as in addition to common oxides containing a single metallic element.

The above-mentioned shift of the chemical composition (hereinafter referred to as "composition") of the thin oxide film away from that of the oxide target is believed to be caused by the following reason:

(1) The negative oxygen ions sputtered from the oxide target are accelerated toward the underlying (e.g. substrate) surface because of a negative target self-bias voltage attributed to a difference in mobility between electrons and sputtering gas ions to allow the resulting accelerated oxygen ions to re-sputter those atoms with a large ion radius which are contained in the thin oxide film being formed; and (2) The heating of the underlying surface for facilitating the crystallization of the thin oxide film being formed, causes atoms and/or molecules having a high vapor pressure to evaporate from the thin oxide film.

This compels the following procedure, for example, to be used in order to form a thin compound oxide film having a desired composition by sputtering. A thin film is first formed, using a compound oxide target having a given composition, to examine the composition of the thin film. Subsequently, a new thin film is formed, using another compound oxide target composed of the same components as those of the former target but having a different ratio in components to examine the, composition of the new thin film as well. This is repeated while by replacing the old target with a new target having a different ratio of components to approximate the composition of a thin film to the above-mentioned desired composition. Since this procedure requires the repetition of sputtering with each target replacement, large amounts of labor and time are needed to complete the formation of the thin film having a desired composition.

The conventional RF magnetron sputtering method using the industrial frequency of 13.56 MHz involves the following problems:

(1) A thin oxide film formed by sputtering using a target having a given composition differs greatly in composition from the target, as above described.

(2) The surface morphology of the resulting thin oxide film is not always good; and (3) The compositional distribution across the whole surface of the thin oxide film is not always uniform.

The present invention has been made in view of the foregoing problems of the conventional method.

Accordingly, an object of the present invention is to provide a process for forming a thin oxide film. The film produced by the process of the present invention has a composition closer to that of the target, than the film from the conventional method, a more uniform across-the-surface compositional distribution as compared with the conventional method, and which may occasionally be excellent in surface morphology (flatness), unlike the film from the conventional method.

SUMMARY OF THE INVENTION

In accordance with the present invention, there is provided a process for forming a thin oxide film on an underlying surface (e.g. substrate) adapted for film formation thereon, according to a radio frequency magnetron sputtering method using an oxide target(s), wherein the excitation frequency is at a frequency higher than 13.56 MHz, which provides a lower negative target self-bias voltage permitting good film formation.

In carrying out the present invention, one oxide target may be used to form a thin oxide film with a single layer structure. Alternatively, a plurality of oxide targets may be used in sequential sputtering to form a thin oxide film with a multi-layer structure. In the latter case, the plurality of oxide targets have either the same kind of components but in different ratios or have both different kinds of components and different ratios of the components. Thus, what targets are used may be suitably determined depending on what the thin oxide film to be formed should be like.

According to an alternative preferred embodiment of the present invention, a metallic target(s) in addition to the oxide target(s), may be used in, the sequential sputtering of these targets, to form a thin oxide film with a multi-layer structure.

According to still another alternative preferred embodiment of the present invention, the oxide target(s) may be a compound oxide target(s).

In the process of the present invention, the excitation frequency for the RF magnetron sputtering of the oxide target(s) is higher than 13.56 MHz. This can lower the negative target self-bias voltage which is attributed to a difference in mobility between the electrons and the sputtering gas ions. As this negative target self-bias voltage is lowered, the energy for acceleration of the oxygen ions, sputtered from an oxide target during film formation, is lowered, with the result that the oxygen ions are kept from re-sputtering those atoms in the thin film being formed. In addition to such a suppressive effect, the energy of the particles, such as other the ions sputtered from the target, is lowered as well, resulting in a reduction of the adverse influences of these particles on film formation.

Since the excitation frequency is higher than the industrial frequency of 13.56 MHz, the amount of high-energy sputtering gas ions reaching the underlying surface (e.g. a substrate beside the target) is decreased. Further, the spread of the energy distribution of the sputtering gas ions is also reduced. This keeps the underlying surface (e.g., substrate) from rising too high in temperature, with the result that atoms and/or molecules having a high vapor pressure will not evaporate.

For the foregoing reasons, film formation using a plurality of targets, as well as a single target, according to the present invention produces a thin oxide film which has a composition closer to that of the target(s) than a film from the conventional method, has a more uniform across-the-surface compositional distribution than a film from the conventional method, and may occasionally be excellent in surface morphology, unlike a film from the conventional method.

BRIEF DESCRIPTION OF THE DRAWINGS

The foregoing and other objects, features and advantages of the present invention will be better understood from the following description taken in connection with the accompanying drawings in which:

FIGS. 8A and 8B are partial reproductions of SEM photographs the thin oxide films formed in Example 1, which are illustrative of the surface morphologies (flatness) of the thin oxide films.

PREFERRED EMBODIMENTS OF THE PRESENT INVENTION

Examples of the present invention will be described while referring to the accompanying drawings.

Figure 2:
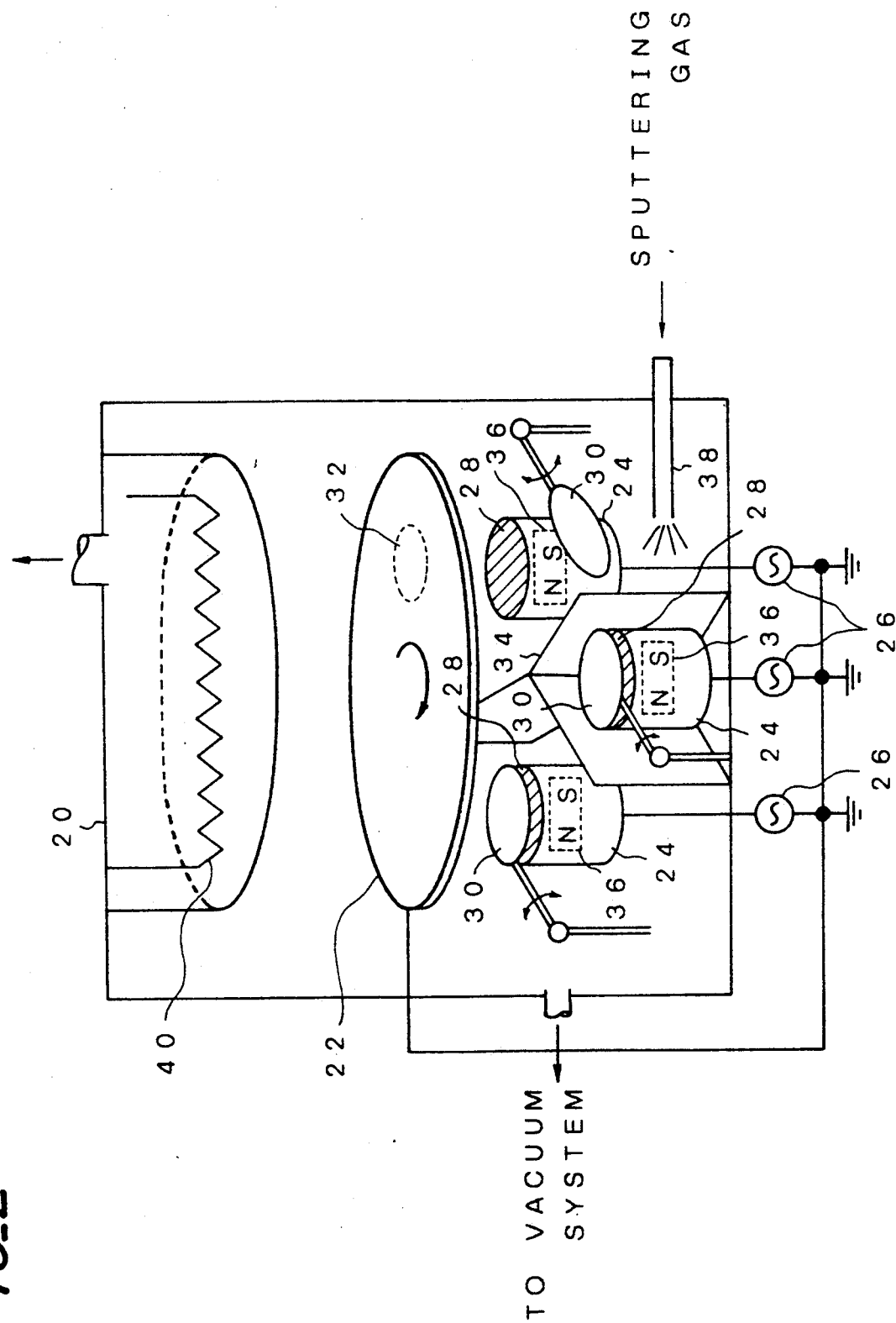
FIG. 2 is a schematic illustration of the structure of the principal part of an RF magnetron sputtering apparatus that may be used for carrying out the process of the present invention for forming a thin oxide film.

The structure of the principal part of a magnetron sputtering apparatus, which can be used to carry out the process of the present invention as shown in the Examples, is shown in FIG. 2 as is described as follows:

This magnetron sputtering apparatus has substantially the same structure as that of a conventional one.

In the apparatus of FIG. 2, a film formation chamber 20 is provided with a turntable 22, capable of rotation, substrate mounting thereon and to serving as an anode, and a plurality of cathodes 24 disposed facing the turntable 22. The distance between the turntable 22 and the cathodes 24 is adjustable. RF power sources 26 are connected to the turntable 22 and the respective cathodes 24 and placed therebetween.

The present invention is characterized in that the formation of a thin oxide film by RF magnetron sputtering using an oxide target(s) is effected using an excitation frequency higher than 13.56 MHz and is capable of providing a lower negative target self-bias voltage permitting good film formation. Accordingly, in the Examples, the RF power sources 26 are replaceable with RF power sources having a frequency of 13.56 MHz, 40.68 MHz, 67.80 MHz, 94.92 MHz, etc., together with their respective matching boxes (not shown in the figure).

The negative target self-bias voltage also varies depending on the kind of target material. Therefore, it cannot be uniformly determined but is believed to be within the range of about several hundreds of volts to about several tens of volts in terms of absolute value.

The upper surfaces of the cathodes 24 serve as surfaces for replaceably mounting thereon a target 28. Rotary shutters 30 are provided for controlling sputtering of the respective targets 28. A substrate 32 is mounted on the turntable 22 in such a way so as to allow a surface thereof, for forming thereon a thin oxide film, to face a cathode 24. Partition walls 34 are provided to isolate the cathodes 24 from each other so as to enable the sputtering operations using the respective cathodes to be done independently of each other. Magnets 36 for forming a magnetic field required to effect RF magnetron sputtering are provided on the respective lower sides of the target surfaces of the cathodes 24. A sputtering gas is fed into the film formation chamber 20 through a gas feed system 38. The film formation chamber 20 is of such a construction that it can be evacuated to a high degree of vacuum by means of an evacuator system. A heater 40 for heating the substrate 32 is provided on the upper side of the turntable 22.

A preferred example of the film formation procedure, which is common to all the following Examples, is as follows:

A substrate 32 is placed on a predetermined area of the turntable 22. The turntable 22 is rotated to position the substrate 32 facing a target 28. Thereafter, a sputtering gas is fed into the film formation chamber 20 through the gas feed system 38.

After the temperature of the substrate 32 and the pressure of the sputtering gas are stabilized, an RF power source 26 is turned on to start the discharge. A shutter associated with a cathode 24 facing the substrate 32 is opened to start the sputtering of the target 28 for film formation.

The sputtering gas is ionized into sputtering gas ions with the energy provided by the RF power source 26. The target 28 is sputtered by the sputtering gas ions.

The particles sputtered from the target 28 travel to the substrate 32 mounted on the turntable 22. The particles deposited on the substrate 32 are crystallized with the aid the heat provided by the heater 40 to form a thin oxide film on the substrate 32.

After film formation, the substrate 32 with the thin oxide film formed thereon is taken out of the film formation chamber 20.

The thin oxide film obtained is evaluated through chemical composition analysis, chemical composition distribution analysis and surface observation thereof by inductively coupled plasma (ICP) spectroscopy, energy dispersive X-ray spectroscopy (EDX) and scanning electron microscopy (SEM), respectively, which are typically used for the kinds of measurements described above. As already described, the composition of the thin oxide film formed from the target differs greatly from the composition of the target. One reason for this is because of the re-sputtering of the thin oxide film being formed. This re-sputtering is caused by negative oxygen ions being accelerated by a negative target self-bias voltage which is attributed to the large difference in mobility between the electrons and the sputtering gas ions. The negative target self-bias voltage approximately corresponds to the sum of the IPC-analyzed atomic concentrations of elements, contained in the thin oxide film and having a low probability of evaporation, in the form of simple metal atoms and/or oxide molecules, among the particles sputtered from the target to reach the substrate.

A description of the specific Examples of the present invention is as follows;

EXAMPLE 1

In this Example, a thin Y—Ba—Cu—O film was formed using one compound oxide target 28 under the representative film formation conditions shown in the attached Table 1.

TABLE 1

| Target | $YBa_2Cu_3O_x$ |
|---|---|
| Substrate | (100)MgO |
| Target-Substrate Distance | 21 mm |
| Substrate Temperature | 607° C. |
| Sputtering Gas | Ar + 20% $O_2$ |
| Sputtering Gas Pressure | 3 mTorr |
| RF Power | 80 W |
| RF Frequency | 13.56 MHz |
| | 40.68 MHz |
| | 67.80 MHz |
| | 94.92 MHz |

A target of 64 mm in diameter manufactured by K.K. Rare Metallic was used as the target 28. The substrate 32 used in this Example was manufactured by K.K. Electronics and Materials Corporation.

After the start of the sputtering operation, the target 28 was sputtered by argon ions and oxygen ions. The resulting sputtered particles were deposited on the substrate 32 to form a thin Y—Ba—Cu—O film, which was then evaluated.

Figure 1:
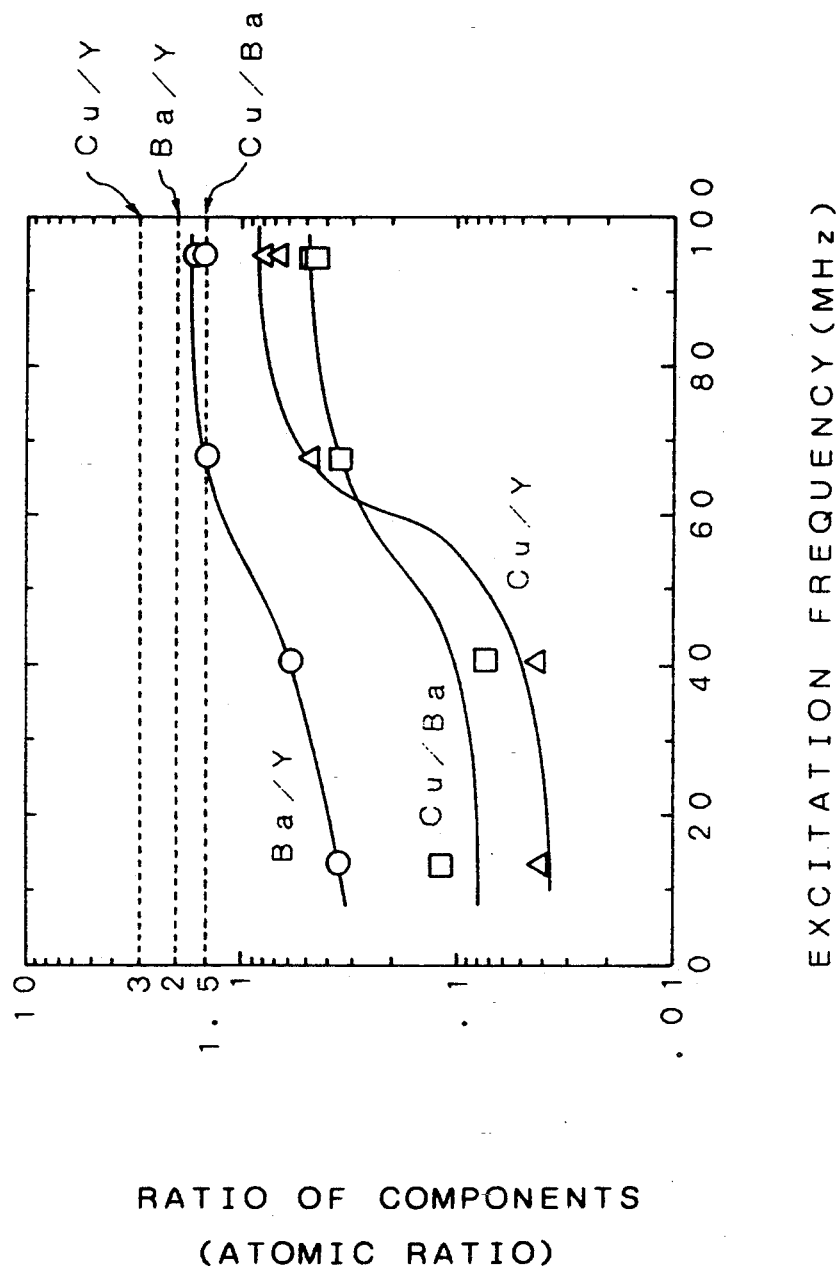
FIG. 1 is a diagram showing the dependency of the composition of a thin oxide film on the excitation frequency.

FIG. 1 is a semi-logarithmic graph showing the dependency of the composition of a thin oxide film formed in the foregoing manner on the excitation frequency, wherein the abscissa and the ordinate represent the excitation frequency (MHz) and the atomic ratio of components plotted in semi-logarithmic scale, respectively. In FIG. 1, the broken lines represent the respective atomic ratios (Cu/Y), (Ba/Y) and (Cu/Ba) of components contained in the target 28, while the solid lines represent the respective atomic ratios (Cu/Y), (Ba/Y) and (Cu/Ba) of components contained in the formed thin Y—Ba—Cu—O film. The results shown in FIG. 1 are also summarized in Tables 2 and 3 listing the compositions of the target and thin oxide films and the shifts of the compositions of the latter away from that of the former, respectively.

TABLE 2

| | Chemical Compositions | |
|---|---|---|
| RF (MHz) | Compound Oxide Target Y:Ba:Cu | Thin Compound Oxide Film Y:Ba:Cu |
| 13.56 | 1:2:3 | 1:0.35:0.04 |
| 40.68 | 1:2:3 | 1:0.6:0.04 |
| 67.80 | 1:2:3 | 1:1.49:0.5 |
| 94.92 | 1:2:3 | 1:1.7:0.8 |

TABLE 3

| | Shifts of the Chemical Compositions | | |
|---|---|---|---|
| RF (MHz) | Ba/Y | Cu/Y | Cu/Ba |
| 13.56 | 1 | 1 | 1 |
| 94.92 | 1/5.5 | 1/1.4 | 1/1.3 |

As can be understood from the experimental data shown in FIG. 1, as well as in Tables 2 and 3, a large difference in composition arose between the compound oxide target with Y:Ba:Cu=1:2:3 and a thin compound oxide film with Y:Ba:Cu=1:0.35:0.04 which was formed under the industrial frequency of 13.56 MHz, while a thin compound oxide film with Y:Ba:Cu=1:1.7:0.8 was formed under an excitation frequency of 94.92 MHz. Thus, it can be understood that the composition of the thin oxide film approaches that of the target as the excitation frequency is raised. By comparison, in the shift of the composition of a thin oxide film away from that of the target, the ratios (Ba/Y) and (Cu/Y) of components of the thin oxide film formed under the excitation frequency of 94.92 MHz are 1/5.5 and 1/1.4, for (Ba/Y) and (Cu/Y) with respect to thin oxide film formed under the industrial frequency of 13.56 MHz. In short, when a thin oxide film is formed by RF magnetron sputtering under an excitation frequency higher than 13.56 MHz, the composition of the thin oxide film is improved so as to be closer to that of the target.

The reason for the improvement in the Ba/Y ratio is believed to be that the increase in the excitation frequency reduces the negative target self-bias voltage which suppresses the selective re-sputtering of Ba with a large ion radius contained in the thin oxide film by negative oxygen ions coming from the target.

Figure 3:
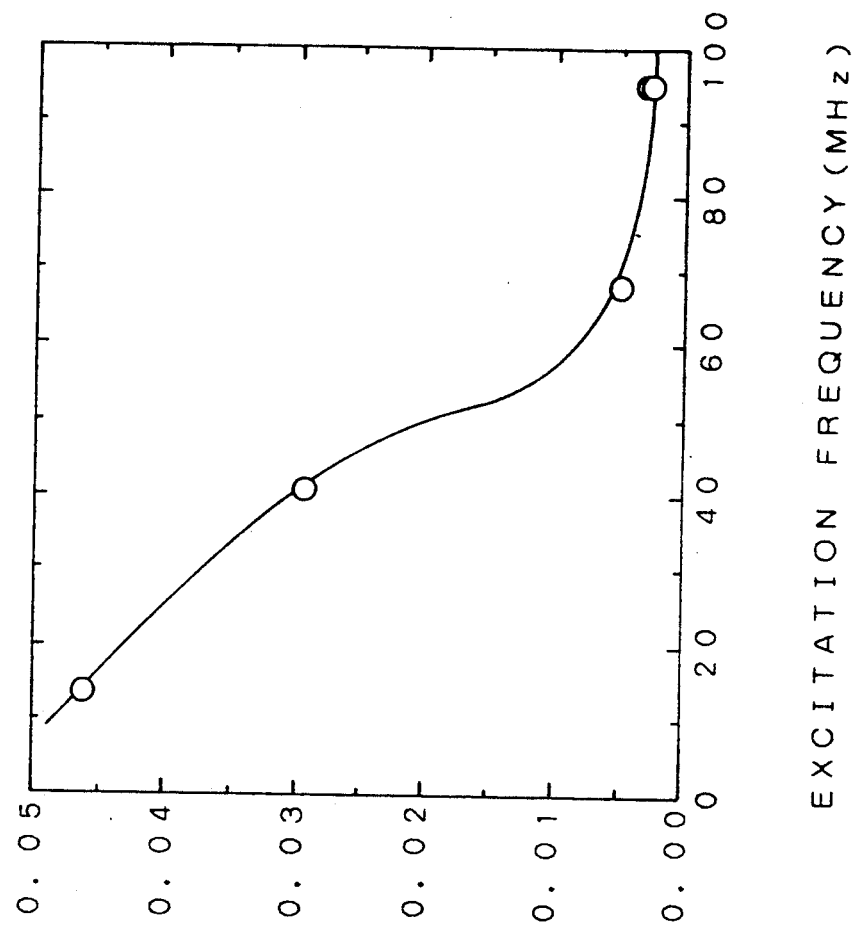
FIG. 3 is a diagram showing the dependency of the atomic concentration of yttrium (Y) in a thin oxide film on the excitation frequency.

The reduction in the negative target self-bias voltage with increasing excitation frequency will also be understandable from the dependency of the atomic concentration of Y on the excitation frequency as shown in FIG. 3 wherein the abscissa and the ordinate represent the excitation frequency (MHz) and the atomic concentration (unit: arbitrary) of yttrium (Y), respectively, and which was drawn based on data obtained by an ICP emission spectroscopic analysis as previously discussed. This data demonstrates that the atomic concentration of an element, having a low vapor pressure when in the form of simple metal atoms and/or oxide molecules [for example, yttrium (Y)], among the constituent elements of a thin compound oxide film decreases as the excitation frequency is raised. Accordingly, it is understood that the negative target self-bias voltage is lowered as the excitation frequency is raised.

The improvement (increase) in the Cu/Y ratio is believed to be because the amount of high-energy sputtering gas ions reaching the substrate, besides those from the target, is decreased with the reduction in the spread of the energy distribution when the excitation frequency is raised. Whereby an excessive rise in the substrate temperature can be reduced thereby to decrease the evaporation, from the thin film, of an element having a high vapor pressure when in the form of simple metal atoms and/or oxide molecules [for example, copper (Cu)].

FIGS. 8A and 8B are partial reproductions of SEM photographs of thin oxide ($YBa_2Cu_3O_X$ in particular) film samples, formed using the foregoing procedure of Example 1 according to the present invention, which are illustrative of the surface morphologies thereof. In the drawings, the length L of the two-headed arrow corresponds to 1 μm. FIG. 8A relates to a sample formed under an excitation frequency of 40.68 MHz, while FIG. 8B relates to a sample formed under an excitation frequency of 94.92 MHz. The magnification of the reproductions of the photographs is 20,000.

In FIG. 8A, the hatched areas 100 are portions protruding from the surface of the sample (there are differences in level in the respective areas), while the blackened areas 102 are holes formed between the protruding portions.

In FIG. 8B, the hatched areas 110 are portions protruding from the surface of the sample (there are differences in level in the respective areas), and the blackened areas 112 are holes formed between the protruding portions, while the white areas 114 are flat portions.

By comparison of the two reproductions with each other, it can be understood that the sample (FIG. 8B) formed under the higher excitation frequency of 94.92 MHz has a larger area of flat portions than the sample (FIG. 8A) formed under the lower excitation frequency of 40.68 MHz.

Thus, the surface observation by SEM of the formed thin compound oxide films shows that the surface morphology thereof can be improved when the excitation frequency exceeds 13.56 MHz. The reasons for the improvement in the surface morphology are believed to be as follows: (1) When the excitation frequency is set higher than the industrial frequency of 13.56 MHz, re-sputtering by the negative oxygen ions is reduced, thereby lessening damage to the surface of a film; and (2) The reduction in the negative target self-bias voltage lowers the energy of particles sputtered from the target so as to allow the particles to gently deposit on the substrate.

The foregoing results substantiate that a thin oxide film, having substantially the same or close to the same composition as a target can be formed by RF magnetron sputtering under an excitation frequency exceeding the industrial frequency of 13.56 MHz.

EXAMPLE 2

In this example, a thin Y—Ba—Cu—O film was formed using two separate targets 28 by sequential deposition under the representative film formation conditions shown in Table 4.

TABLE 4

| Target | |
|---|---|
| Target I | $YBa_2Cu_3O_x$ |
| Target II | Cu |
| Substrate | (100)MgO |
| Target-Substrate Distance | 22 mm |
| Substrate Temperature | 607° C. |
| Sputtering Gas | Ar + 20% $O_2$ |
| Sputtering Gas Pressure | 6 mTorr |
| RF Power | |
| Target I | 80 W (94.92 MHz) |
| Target II | 50 W (67.80 MHz) |
| Cycle of Sputtering | |
| Target I | 60 sec |
| Target II | N sec (N = 0 to 10) |
| Repeated | 60 times |

One target was a compound oxide target made of $YBa_2Cu_3O_x$ (wherein "X" is the number of oxygen atoms and is not determined) (target I), while the other target was a copper (Cu) target (target II). Both of the targets had a diameter of 64 mm. The copper (Cu) target was used in order to control the amount of Cu in the thin Y—Ba—Cu—O film. In this Example, the pressure of the sputtering gas was 6 mTorr, and the distance between the substrate 32 and the targets 28 was 22 mm. Targets I and II were sputtered alternately to form a thin oxide film with a multi-layer structure. The RF power for target I was 80 W (94.92 MHz), while RF power for the target II was 50 W (67.80 MHz). The cycle of sputtering target I for 60 seconds and sputtering target II for N seconds, wherein N=0 to 10, was repeated 60 times.

Figure 4:
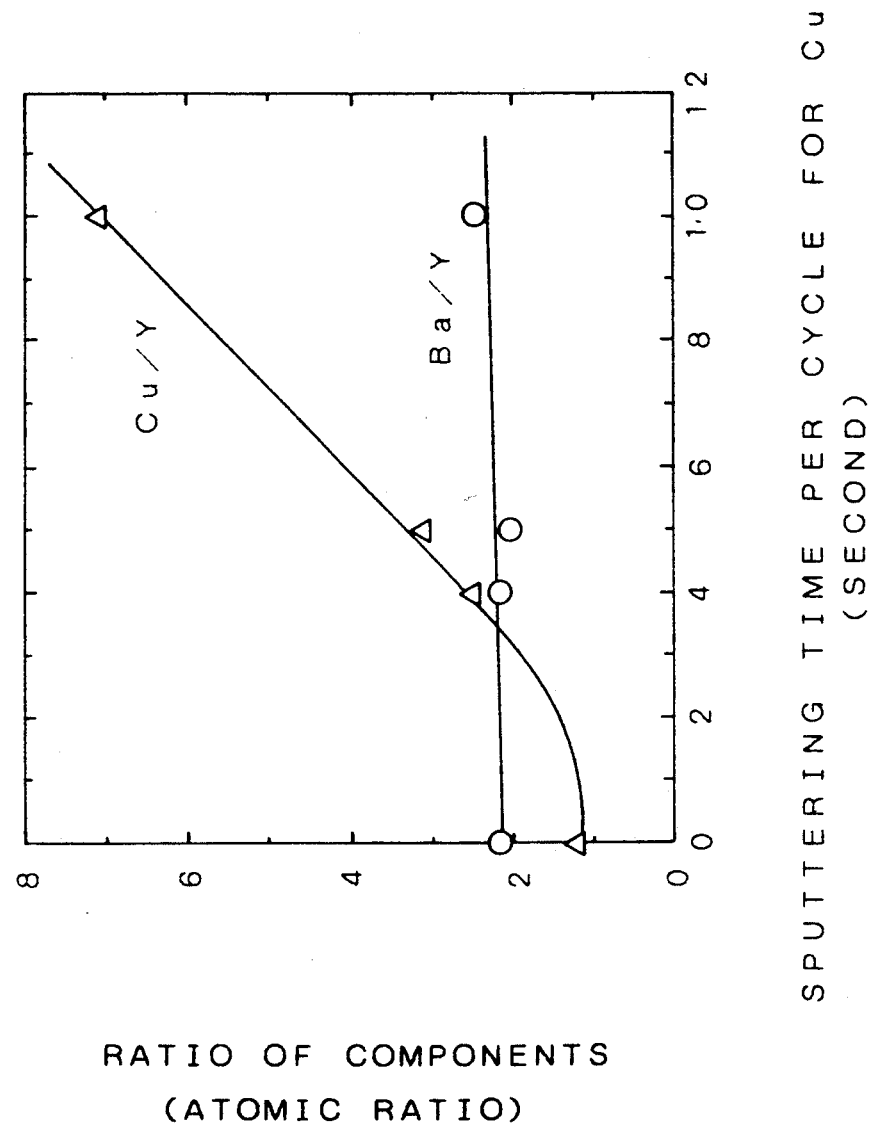
FIG. 4 is a diagram showing a variation of the composition of a thin multi-layer oxide film with the sputtering time.

FIG. 4 shows the variation of the composition of the thin multi-layer oxide film obtained in this Example with the sputtering time. In FIG. 4, the abscissa represents the sputtering time per cycle for Cu, while the ordinate represents the atomic ratio of components in the thin multi-layer oxide film, which were determined in the same manner as in Example 1.

As can be understood from the experimental data, as the above-mentioned sputtering time increased from zero to 10 seconds, the atomic ratio (Cu/Y) increased from about 1.2 to about 7, while the atomic ratio (Ba/Y) was substantially constant. The data substantiates that the amount of Cu contained in a thin multi-layer oxide film being formed can be controlled only by changing the sputtering time per cycle for Cu.

The reason for the controllability of the composition of the thin multi-layer oxide film by changing the above-mentioned sputtering time is believed to be that a change in the composition of the thin multi-layer oxide film, attributable to re-sputtering and a difference in the substrate temperature between the sputtering operations for the two different targets (Y—Ba—Cu—O target and Cu target), could be suppressed.

It can be presumed that the thin oxide films obtained in Example 2 show substantially the same tendencies, as in Example 1, with respect to the dependency of the composition on the excitation frequency, the dependency of the atomic concentration of Y on the excitation frequency, and the surface morphology.

Thus, the composition of a thin oxide film can be controlled by alternate repetition of RF magnetron sputtering of multiple targets under an excitation frequency exceeding 13.56 MHz.

EXAMPLE 3

Figure 5:
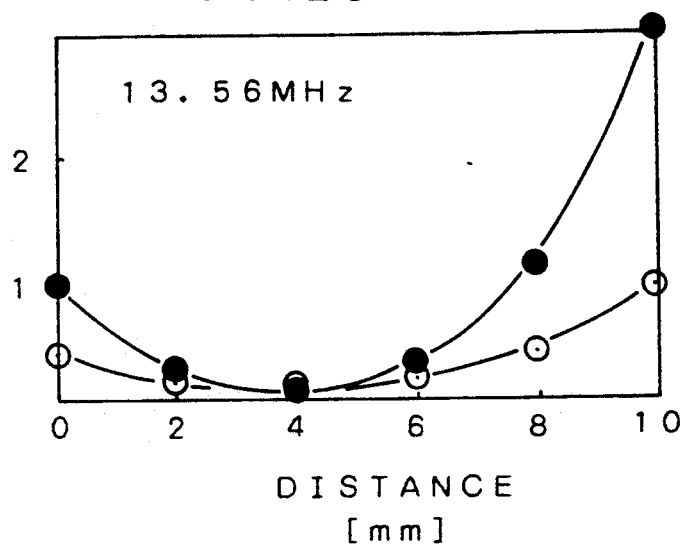
FIGS. 5A to 5D are diagrams demonstrative of the dependency of the across-the-surface compositional distribution (in terms of the distribution of integral intensity ratio) of a thin oxide film on the excitation frequency.
Figure 5:
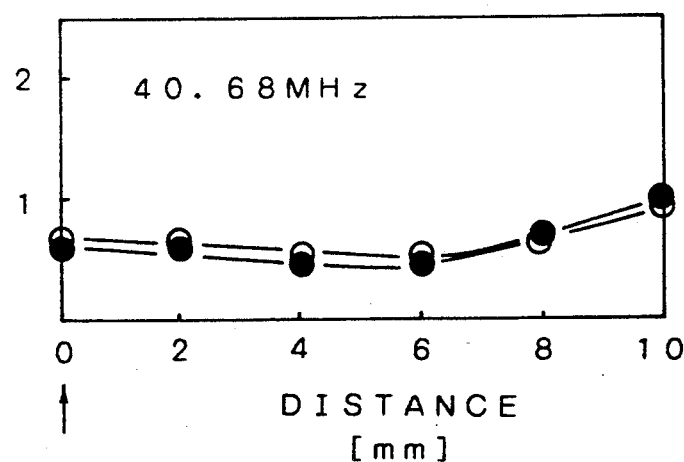

In this Example, thin oxide films were respectively formed under varied excitation frequencies in substantially the same manner as in Example 1 and under substantially the same film formation conditions as shown in Table 1 except that room temperature was used as the substrate temperature. FIGS. 5A to 5D are diagrams illustrating the dependencies of the across-the-surface integrated intensity ratio distributions of thin oxide film on the excitation frequency. In these figures, the abscissa represents the distance (mm) from the center of the substrate, which was measured in the radial direction of the substrate surface, while the ordinate represents the integral intensity ratio. FIG. 5A relates to a comparative thin oxide film formed under an excitation frequency of 13.56 MHz, while FIGS. 5B, 5C and 5D relate to thin oxide films formed under excitation frequencies of 40.68 MHz, 67.80 MHz and 94.92 MHz, respectively. In this example, the across-the-surface integral intensity ratio distributions were found using EDX, with the intensity integration range being from 1.81 KeV to 2.14 KeV for yttrium (Y), from 4.34 KeV to 4.64 KeV for barium (Ba) and from 7.84 KeV to 8.26 KeV for copper (Cu). In these figures, the curves denoted by ○ are for integral intensity ratios (Cu/Y), while the curves denoted by ● are for integral intensity ratios (Ba/Y). Here, the ratios of the integral intensity assigned to Cu or Ba to the integral intensity assigned to Y are used. This is to avoid the influence of the film thickness distribution on the data. The integrated intensity ratios are reflective of the corresponding atomic ratios of components.

It can be seen from the data on the across-the-surface integrated intensity ratio distribution, that the integrated intensity ratios (Ba/Y) and (Cu/Y), of the thin oxide film formed under the industrial frequency of 13.56 MHz, are lowest within a region about 4 mm from the center of the substrate. This is believed to be attributed to the re-sputtering of the thin oxide film being formed by negative oxygen ions, as previously described. By contrast, when the excitation frequency is higher than the industrial frequency of 13.56 MHz, the integrated intensity ratios (Ba/Y) and (Cu/Y) tended to increase substantially all across the surface of the thin oxide film. Furthermore, the fluctuations of the integrated intensity ratios with the position of the surface of every thin oxide film formed under an excitation frequency exceeding 13.56 MHz were decreased as compared with those for the thin oxide film formed under the industrial frequency of 13.56 MHz. The reason for these facts are believed to be that the re-sputtering by negative oxide ions was reduced, with increasing uniformity of the composition distribution as the excitation frequency was raised higher. Such a trend toward a uniform across-the-surface atomic ratio distribution can be expected as well in the case of a higher substrate temperature as in Examples 1 and 2 as well as in the case of film formation using multiple targets.

EXAMPLE 4

In this Example, sequential deposition was effected using three targets under an excitation frequency of 40.68 MHz. The three targets were target I made of $YBa_2Cu_3O_x$, target II made of $BaCuO_x$, and a target III made of Copper (Cu) (wherein "X" is the number of oxygen atoms and is not determined). A (100) MgO substrate was used. Other film formation conditions are as follows: (1) The substrate temperature was 650° C.; (2) A sputtering gas (Ar+ 20-25% $O_2$) was used under a sputtering gas pressure of 0.8 Pa (6 mTorr) and (3) The cycle of sequential sputtering of targets I, II and III was repeated 10 times to form a thin Y—Ba—Cu—O film with a multi-layer structure; the composition of which was examined by IPC.

Figure 6:
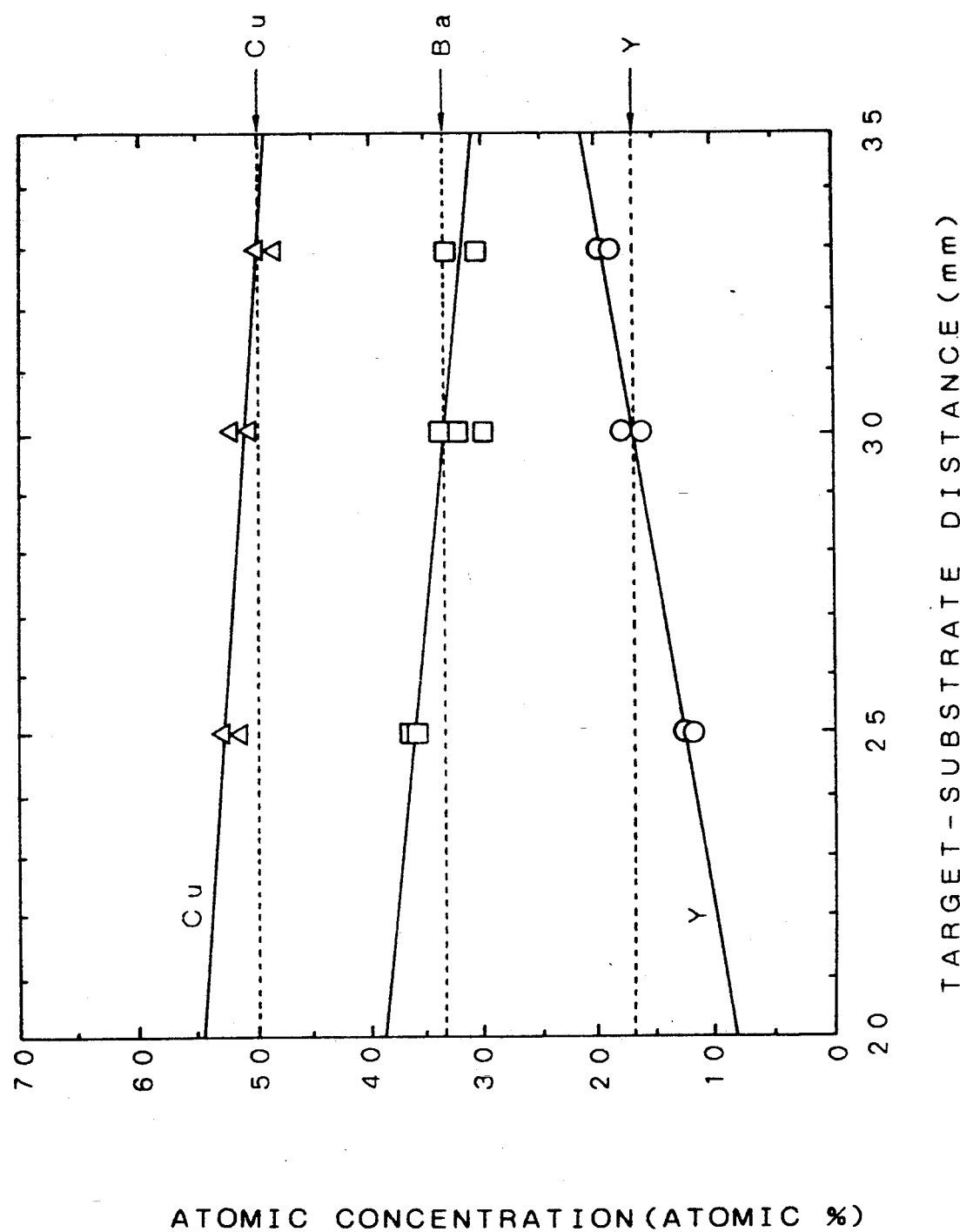
FIG. 6 is a diagram showing the dependencies of the atomic concentrations of metallic elements in a thin oxide film on the distance between a target and a substrate.

FIG. 6 is a diagram showing the dependency of the composition of the thin oxide films obtained the this Example on the target-substrate distance, wherein in abscissa and the ordinate represent the target-substrate distance (mm) as a parameter and the atomic concentration (atomic %), respectively. The atomic concentration of copper (Cu), barium (Ba) and yttrium (Y) in thin oxide films formed with respective target-substrate distances of 33 mm, 30 mm and 25 mm are plotted in FIG. 6. As can be seen from the experimental data shown in FIG. 6, the atomic ratio (Cu/Ba) of components approached a substantially constant value of about 1.5 as the target-substrate distance increased. Further, as the target-substrate distance, increased the atomic concentration of Y increased while the atomic concentrations of Cu and Ba tended to slightly decrease. Accordingly the Y content of a thin oxide film increased, thereby changing the atomic ratios of components in the thin oxide film as the target-substrate distance increased. Therefore, a thin oxide film having a desired composition substantially the same as or close to the composition of target I can be formed by changing the target-substrate distance. In addition, the film formation rate was examined as to each of the thin oxide films formed in this Example. The rate was 0.8 Å/sec when the target-substrate distance was 33 mm, and 1.2 Å/sec when the target-substrate distance was 25 mm. Thus, the film formation rate was sufficiently high even when RF magnetron sputtering under the excitation frequency of 40.68 MHz. The control of the atomic ratio of components was also satisfactory.

EXAMPLE 5

Film formation was done using the same three targets as used in Example 4. Thin Y—Ba—Cu—O films were formed under substantially the same film formation conditions as in Example 4 except that the substrate temperature was 750° C. or 700° C. and the sputtering gas (Ar+20% $O_2$) was used under a pressure of 6 mTorr. In this Example, the evaluation of the thin oxide film was made by IPC, XRD and SEM.

Figure 7:
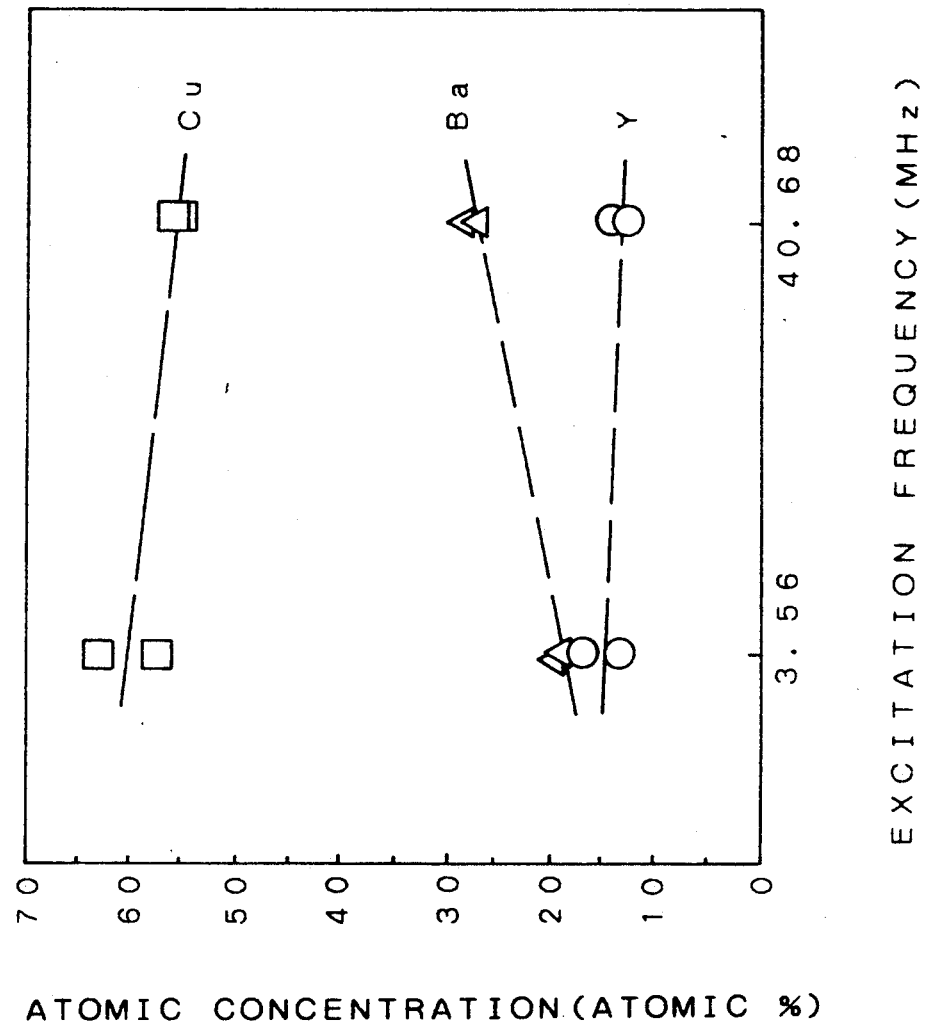
FIG. 7 is a diagram showing the dependencies of the atomic concentrations of metallic elements in a thin oxide film on the excitation frequency.

FIG. 7, shows the dependency of the atomic concentrations the components in a thin oxide film on the excitation frequency, wherein the abscissa and the ordinate represent the excitation frequency (MHz) and the atomic concentration (atomic %). At either substrate temperature, the atomic concentration of yttrium (Y) was not substantially different between 13.56 MHz and 40.68 MHz. Whereas the atomic concentrations of barium (Ba) and copper (Cu) showed an upward trend and a downward trend, respectively, when the excitation frequency was raised from 13.56 MHz to 40.68 MHz. Thus, it can be seen that the composition of a thin oxide film varies when the excitation frequency is changed. Accordingly, a thin oxide film having a desired composition substantially the same as or close to the composition of a target can be formed by RF magnetron sputtering under an excitation frequency exceeding 13.56 MHz.

The thin oxide films obtained in this Example were examined by X-ray diffractometry and it was determined that the thin oxide films formed at the substrate temperature of 750° C. exhibited (001) reflection of $YBa_2Cu_3O_{7-x}$, while the thin oxide films formed at the substrate temperature of 700° C. exhibit (110) and (220) reflection. The subscript "X" in $YBa_2Cu_3O_{7-x}$ represents the proportion of oxygen in the composition, provided that the value of "X" is represented by the formula: $0 \leq X23$ 1.

The foregoing Examples 1 to 5 are all preferred embodiments of the present invention. Thus, it should be understood that the present invention is not restricted to the various materials, numerical conditions, and other conditions exemplified in these Examples.

For example, any target can be used as long as it is made of an oxide, examples of which include MgO and $Y_2O_3$. In the case of a compound oxide target, the use of a material different in bonded elements other than oxygen ($O_2$) from the materials mentioned hereinbefore, for example, $SrTiO_3$ or like material, is also expected to provide the same trends as in the foregoing Examples.

While (100) MgO substrates have been used as the underlying surface for film formation thereon in the foregoing Examples, various substrates made of other suitable material can be used as well. Further, any underlying surface suitable for film formation thereon will do even if it cannot be called a "substrate".

The distance between the underlying surface and the target must at least be such so that the particles sputtered from the target are able to adhere to the underlying surface. This distance may be suitably determined in accordance with the mean free path of the sputtered particles, sputtering gas pressure, etc.

The substrate temperature may be such as to allow the sputtered particles deposited on the underlying surface to readily crystallize in accordance with the kinds of components thereof.

Any sputtering gas can be used in so far as it is suited to sputter the target. Examples of sputtering gas include argon as used in the foregoing Examples, other rare-gas elements, mixtures thereof with oxygen, and oxygen ($O_2$) alone. Any RF power capable of ionizing the sputtering gas will do. Any excitation frequency exceeding 13.56 MHz will do in so far as it can provide a suitable lower negative target self-bias voltage permitting film formation. Accordingly, while the maximum excitation frequency used in the foregoing Examples in 94.92 MHz, it is expected that a higher excitation frequency may actually be used in the RF magnetron sputtering process of the present invention as well.

While a fixed excitation frequency has been used throughout the sputtering to form the single thin oxide films in the foregoing Examples, the excitation frequency may be changed during the sputtering to form a single thin oxide film.

While sequential sputtering of target I, target II and target III in this order was effected in the Examples when the three targets were used, the order of sequential sputtering of targets may be arbitrarily determined in accordance with the design of a thin oxide film.

As will be apparent from the foregoing description, the RF magnetron sputtering of an oxide target(s) is effected under an excitation frequency exceeding 13.56 MHz according to the process of the present invention for forming a thin oxide film. This will provide the following effects:

(2) Since the negative target self-bias voltage is lowered, re-sputtering of those atoms in a thin oxide film, being formed by negative oxygen ions sputtered from the target, can be suppressed while keeping other particles sputtered from the target from adversely affecting the thin oxide film; and (2) Since the amount of high-energy sputtering gas ions reaching the target and an underlying surface for film formation thereon is decreased, while at the same time reducing the width of the energy distribution of sputtering gas ions, an excessive rise in the temperature of the underlying surface can be held down to keep atoms and/or molecules having a high vapor pressure from evaporating.

For the foregoing reasons, a thin oxide film having a desired composition substantially the same as or close to the composition of a target can be formed using either a single target or multiple targets can be formed using either a single target or multiple targets according to the present invention. Furthermore, the across-the-surface atomic ratio distribution of the thin oxide film is more uniform than that of a thin oxide film formed under the industrial frequency of 13.56 MHz. Moreover, the surface flatness of the thin oxide film may be excellent.

What is claimed is:

1. A process for forming a thin oxide film on an underlying surface adapted for film formation thereon according to a ratio frequency magnetron sputtering method using at least one oxide target,
   wherein said at least one oxide target comprises a single compound oxide of yttrium, barium, and copper, and
   wherein the excitation frequency is higher than 13.56 MHz, which provides a lower negative target self-bias voltage, permitting improved film formation.

2. A process as claimed in claim 1, wherein said at least one oxide target is made of $YBa_2Cu_3O_x$.

3. A process as claimed in claim 1, wherein said at least one oxide target comprises a plurality of oxide targets and the process forms a thin oxide film with a multi-layer structure by sputtering each of said plurality of oxide targets.

4. A process as claimed in claim 1, wherein said sputtering method uses, in addition to said at least one oxide target, at least one metallic target together with said at least one oxide target to form a thin oxide film with a multi-layer structure by sputtering each of said targets.

5. A process as claimed in claim 4, wherein said at least one oxide target includes a compound oxide target made of $YBa_2Cu_3O_x$ and said metallic target is made of Cu.

6. A process as claimed in claim 5, wherein said compound oxide target is sputtered alternately with said metallic target.

7. A process as claimed in claim 5, wherein the sputtering time for said metallic target is shorter than the sputtering time for said compound oxide target.

8. A process as claimed in claim 4, wherein said at least one oxide target includes a first target made of compound $YBa_2Cu_3O_x$, and a second target made of a compound oxide $BaCuO_x$, and wherein said metallic target comprises a third target made of Cu.

9. A process as claimed in claim 8, wherein sequential sputtering of said first target, said second target and said third target is repeated.

10. A process as claimed in claim 4, wherein said excitation frequency for the compound oxide target is 94.92 MHz and said excitation frequency for the metallic target is 67.80 MHz.

11. A process as claimed in claim 1, wherein said excitation frequency is at least 40.68 MHz.

12. A process as claimed in claim 1, wherein said excitation frequency is at least 67.80 MHz.

13. A process as claimed in claim 1, wherein said excitation frequency is at least 94.92 MHz.

* * * * *